United States Patent
Cho

(10) Patent No.: US 8,951,882 B2
(45) Date of Patent: Feb. 10, 2015

(54) METHOD OF FABRICATING OPTOELECTRONIC INTEGRATED CIRCUIT SUBSTRATE

(71) Applicant: Samsung Electronics Co., Ltd., Suwon-Si, Gyeonggi-Do (KR)

(72) Inventor: Seong-ho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/868,497

(22) Filed: Apr. 23, 2013

(65) Prior Publication Data

US 2014/0141546 A1 May 22, 2014

(30) Foreign Application Priority Data

Nov. 21, 2012 (KR) .......................... 10-2012-0132607

(51) Int. Cl.
*H01L 21/76* (2006.01)
*H01L 21/762* (2006.01)

(52) U.S. Cl.
CPC .................................. *H01L 21/762* (2013.01)
USPC ........... 438/423; 438/406; 438/459; 438/455; 257/635; 257/637

(58) Field of Classification Search
CPC ..................... H01L 27/1463; H01L 27/14689; H01L 21/76254; H01L 21/76264; H01L 21/76224
USPC .......... 257/348, 415, 506, 635, 637, E21.545, 257/E29.02, E21.122, E21.564, E21.24, 257/E21.567; 438/423, 406, 459, 455, 118, 438/424, 458, 692, 761; 385/2; 361/119
See application file for complete search history.

(56) References Cited

U.S. PATENT DOCUMENTS

| | | | | |
|---|---|---|---|---|
| 5,238,865 A * | 8/1993 | Eguchi | ........................ | 438/406 |
| 5,459,104 A * | 10/1995 | Sakai | ............................ | 438/406 |
| 6,242,320 B1 * | 6/2001 | So | ................................. | 438/406 |
| 6,503,811 B1 * | 1/2003 | Ohkubo | ....................... | 438/406 |
| 6,661,071 B2 * | 12/2003 | Lenssen et al. | .............. | 257/422 |
| 6,664,146 B1 * | 12/2003 | Yu | ................................ | 438/149 |
| 6,855,620 B2 * | 2/2005 | Koike et al. | ................... | 438/481 |
| 6,955,971 B2 * | 10/2005 | Ghyselen et al. | ............ | 438/406 |

(Continued)

FOREIGN PATENT DOCUMENTS

JP 5-21766 A 1/1993
JP 2001-015720 A 1/2001

(Continued)

OTHER PUBLICATIONS

Sridaran et al., "Nanophotonic devices on thin buried oxide Silicon-on-Insulator substrates", Optics Express, vol. 18, pp. 3851-3857 (2010).*

*Primary Examiner* — Marvin Payen
*Assistant Examiner* — Victor Barzykin
(74) *Attorney, Agent, or Firm* — Harness, Dickey & Pierce, P.L.C.

(57) ABSTRACT

A method of fabricating an optoelectronic integrated circuit substrate includes defining a photonic device region on a first substrate, the photonic device region having a photonic device formed thereon, forming a trench in the photonic device region on a top surface of the first substrate, the trench having a first depth, filling the trench with a dielectric, bonding a second substrate on the first substrate to cover the trench, and thinning the second substrate to a first thickness.

15 Claims, 8 Drawing Sheets

(56) References Cited

U.S. PATENT DOCUMENTS

| | | | |
|---|---|---|---|
| 7,109,051 B2 * | 9/2006 | Cave et al. | 438/29 |
| 7,317,226 B2 | 1/2008 | Fogel et al. | |
| 7,422,958 B2 * | 9/2008 | Kostrzewa et al. | 438/406 |
| 7,494,897 B2 * | 2/2009 | Fournel et al. | 438/455 |
| 7,541,263 B2 * | 6/2009 | Moriceau et al. | 438/459 |
| 7,781,300 B2 * | 8/2010 | Moriceau et al. | 438/405 |
| 7,942,182 B2 * | 5/2011 | Trezza et al. | 156/581 |
| 7,947,564 B2 * | 5/2011 | Kostrzewa et al. | 438/406 |
| 7,968,944 B2 | 6/2011 | Joshi et al. | |
| 7,989,248 B2 * | 8/2011 | Kumar et al. | 438/51 |
| 7,989,958 B2 * | 8/2011 | Trezza et al. | 257/777 |
| 8,008,105 B2 * | 8/2011 | Huang | 438/52 |
| 8,041,158 B2 * | 10/2011 | Gill et al. | 385/14 |
| 8,101,458 B2 * | 1/2012 | Kumar et al. | 438/106 |
| 8,197,626 B2 * | 6/2012 | Trezza et al. | 156/228 |
| 8,270,779 B2 * | 9/2012 | Gill et al. | 385/2 |
| 8,652,934 B1 * | 2/2014 | Meade et al. | 438/427 |
| 2004/0150067 A1 * | 8/2004 | Ghyselen et al. | 257/506 |
| 2007/0202660 A1 * | 8/2007 | Moriceau et al. | 438/424 |
| 2007/0259528 A1 * | 11/2007 | Moriceau et al. | 438/702 |
| 2009/0002910 A1 * | 1/2009 | Liu et al. | 361/119 |
| 2010/0140708 A1 * | 6/2010 | Hill et al. | 257/348 |
| 2012/0098122 A1 * | 4/2012 | Yang | 257/737 |
| 2013/0037907 A1 * | 2/2013 | Cho | 257/506 |

FOREIGN PATENT DOCUMENTS

| | | |
|---|---|---|
| JP | 3216535 B2 | 10/2001 |
| JP | 2009-026929 A | 2/2009 |
| KR | 1997-0052808 A | 7/1997 |

* cited by examiner

METHOD OF FABRICATING OPTOELECTRONIC INTEGRATED CIRCUIT SUBSTRATE

CROSS-REFERENCE TO RELATED APPLICATIONS

This application claims the benefit of Korean Patent Application No. 10-2012-0132607, filed on Nov. 21, 2012, in the Korean Intellectual Property Office, the disclosure of which is incorporated herein in its entirety by reference.

BACKGROUND

1. Field

Example embodiments relate to an optoelectronic integrated circuit substrate proper for simultaneously implementing a photonic device, an electronic device, and a microelectromechanical systems (MEMS) structure.

2. Description of the Related Art

Semiconductor integrated circuits are integrated into a printed circuit substrate and perform electrical communication with each other through wires in order to transmit and receive data. In this connection, there are limitations in reducing the electrical resistances between the semiconductor integrated circuits. Additionally, the electrical communication may be affected by external electron waves. Due to this reason, it is hard to increase the communication speed between the semiconductor integrated circuits.

Recently, in order to address this problem, optical interconnect or optical communication has been employed. Optical signals containing various pieces of information are transmitted and/or received via optical communication. Also, optical communication is less affected by external electromagnetic waves and allows for high-speed communication, compared to electrical communication.

In order to perform optical communication between semiconductor integrated circuits, a photonic device needs to be implemented together with a semiconductor integrated circuit. Additionally, a region where an optical fiber for optical communication is to be placed is required and a MEMS region where a MEMS structure is to be formed may be required.

In order to implement a photonic device and an electronic device together, a silicon on insulator (SOI) substrate may be used. The SOI substrate includes a buried oxide layer having a predetermined or given thickness at a predetermined or given depth from the surface of the SOI substrate and an epi layer formed on the buried oxide layer.

However, the thicknesses of the epi layer and the buried oxide layer suitable for an electronic device and a photonic device are different from each other, and no buried oxide layer is necessary in a region requiring a MEMS structure. Accordingly, a substrate suitable for implementing such optoelectronic integrated circuit is required.

SUMMARY

Example embodiments provide a method of fabricating an optoelectronic integrated circuit substrate for fabricating a substrate having a region where dielectric layers having different thicknesses are formed at different depths.

Additional aspects will be set forth in part in the description which follows and, in part, will be apparent from the description, or may be learned by practice of example embodiments.

According to example embodiments, a method of fabricating an optoelectronic integrated circuit substrate includes defining a photonic device region on a first substrate, the photonic device region having a photonic device formed thereon, forming a trench in the photonic device region on a top surface of the first substrate, the trench having a first depth, filling the trench with a dielectric, bonding a second substrate on the first substrate to cover the trench, and thinning the second substrate to a first thickness.

A first depth may be in a range of about 0.5 µm to about 3 µm. In The dielectric may include at least one of air, an oxide, and a nitride. The first thickness may be in a range of about 100 nm to about 500 nm. The first substrate may include one of a semiconductor, a dielectric, and a polymer.

According to example embodiments, a method of fabricating an optoelectronic integrated circuit substrate includes defining a photonic device region and an electronic device region on a first substrate, forming a first trench in the photonic device region and a second trench in the electronic device region, respectively, on a top surface of the first substrate, the first trench and the second trench having a first depth and a second depth, respectively, filling the first trench and the second trench with a dielectric, bonding a second substrate on the top surface of the first substrate, thinning the second substrate to a first thickness, and forming regions of the second substrate corresponding to the photonic device region and the electronic device region to have a second thickness and a third thickness, respectively.

The first depth may be in a range of about 0.5 µm to about 3 µm and the second depth may be in a range of about 1 nm to about 200 nm. The dielectric may include at least one of air, an oxide, and a nitride. Forming the regions of the second substrate corresponding to the photonic device region and the electronic device region may include exposing the region of the second substrate corresponding to the photonic device region, forming a layer having the same material as the second substrate to have the second thickness in the exposed region of the second substrate corresponding to the photonic device region, and the third thickness may be equal to the first thickness.

The region of the second substrate corresponding to the photonic device region may have the second thickness in a range of about 100 nm to about 500 nm and the region of the second substrate corresponding to the electronic device region may have the third thickness in a range of about 1 nm to about 100 nm. Forming the regions of the second substrate corresponding to the photonic device region and the electronic device region may include exposing the region of the second substrate corresponding to the electronic device region, selectively etching the exposed region of the second substrate corresponding to the electronic device region to have a thickness equal to the third thickness, and the second thickness may be equal to the first thickness.

According to example embodiments, a method of fabricating an optoelectronic integrated circuit substrate may include defining a photonic device region and an electronic device region on a first substrate, forming a first trench in the photonic device region and a second trench in the electronic device region, respectively, on a top surface of the first substrate, the first trench and the second trench having a first depth and a second depth, respectively, filling the first trench and the second trench with a dielectric, forming a concave part by selectively etching the dielectric of the photonic device region to a first thickness from the top surface of the first substrate, forming a convex part by etching a region of a second substrate different from a region corresponding to the photonic device region to the first thickness, coupling the convex part with the concave part by bonding the second substrate on the top surface of the first substrate, and thinning the second substrate to have a second thickness on a top surface of the dielectric in the photonic device region and a third thickness on a top surface of the dielectric in the electronic device region.

The first depth may be in a range of about 0.5 μm to about 3 μm and the second depth may be in a range of about 1 nm to about 200 nm. The dielectric may include at least one of air, an oxide, and a nitride. The dielectric of the photonic device region may be selectively etched to the first thickness in a range of about 100 nm to about 500 nm. The second substrate may be thinned to have the second thickness in a range of about 100 nm to about 500 nm and the third thickness in a range of about 1 nm to about 100 nm.

Filling the first trench and the second trench may include filling each of the first trench and the second trench with the dielectric having a fourth thickness, removing the dielectric in the second trench on the top surface of the first substrate, and the fourth thickness may be less than the first depth by the first thickness. The fourth thickness may be in a range of about 0.5 μm to about 3 μm.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
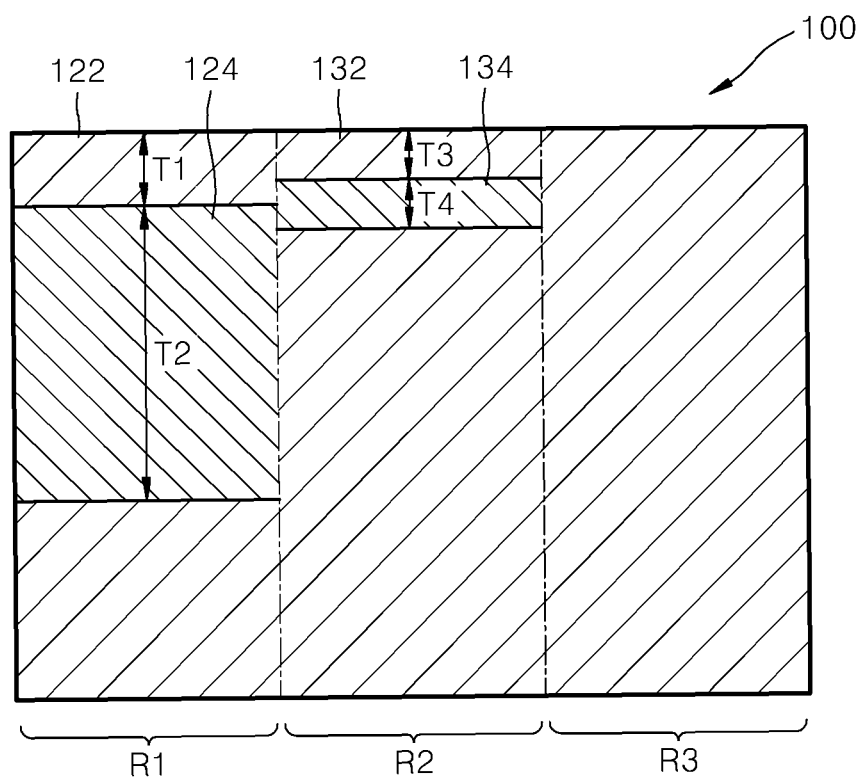
FIG. 1 is a cross-sectional view illustrating a structure of an optoelectronic integrated circuit substrate manufactured according to example embodiments.

Reference will now be made in detail to embodiments, examples of which are illustrated in the accompanying drawings, wherein like reference numerals refer to the like elements throughout. In this regard, example embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIG. 1 is a cross-sectional view illustrating a structure of an optoelectronic integrated circuit substrate 100 manufactured according to example embodiments.

Referring to FIG. 1, the optoelectronic integrated circuit substrate 100 includes a photonic device region R1, an electronic device region R2, and a micro-electromechanical systems (MEMS) region R3. The optoelectronic integrated circuit substrate 100 shown in FIG. 1 may be one chip region diced from a wafer.

The optoelectronic integrated circuit substrate 100 may be formed of a semiconductor, a dielectric, or a polymer. The semiconductor may be a silicon, gallium arsenide, or indium phosphide (InP). Hereinafter, it will be assumed that the optoelectronic integrated circuit substrate 100 is formed of silicon.

A photonic device is formed on the photonic device region R1, an electronic device is formed on the electronic device region R2, and a MEMS structure is formed on the MEMS region R3. The photonic device, the electronic device, and the MEMS structure may be fabricated by performing a semiconductor process on the substrate 100 or by placing a separate circuit chip on the substrate 100.

A dielectric layer is formed on each of the photonic device region R1 and the electronic device region R2. A dielectric layer is not formed on the MEMS region R3. The depths and thicknesses of the dielectric layer in the photonic device region R1 and the electronic device region R2 may be different from each other.

A first silicon epi layer 122 having a first thickness T1 from a surface of the substrate 100 may be formed in the photonic device area R1, and a first dielectric layer 124 having a second thickness T2 may be formed under the first silicon epi layer 122. The first dielectric layer 124 may be an air layer, or may be formed of a silicon oxide or a silicon nitride. The first thickness T1 is in the range of about 100 nm to about 500 nm. If the first thickness T1 is less than about 100 nm, it is difficult to confine an optical guide and optical leak may occur. If the first thickness T1 is greater than about 500 nm, the volume of the optical guide becomes larger, so that a size of a photonic device becomes larger. The photonic device may include a laser, a light emitting diode, an optical modulator, a multiplexer/demultiplexer, a photodiode, and a waveguide.

The second thickness T2 is in the range of about 0.5 μm to about 3 μm. If the second thickness T2 is less than about 0.5 μm, because light is not confined due to optical leak, propagation loss becomes greater. If the second thickness T2 is greater than about 3 μm, heat dissipation is difficult and a photonic device becomes larger.

A second silicon epi layer 132 having a third thickness T3 from the surface of the substrate 100 may be formed in the electronic device area R2, and a second dielectric layer 134 having a fourth thickness T4 may be formed under the second silicon epi layer 132. The second dielectric layer 134 may be an air layer, or may be formed of a silicon oxide or a silicon nitride. The third thickness T3 is in the range of about 1 nm to about 100 nm. This thickness may vary according to the design of an electronic device or the channel length of a transistor. If the third thickness T3 is less than about 1 nm, forming an electron channel path may be difficult. If the third thickness T3 is greater than about 100 nm, a parasite capacitance may be increased so that a high-speed operation of an electronic device may become more difficult. The electronic device may include a transistor and a diode.

The fourth thickness T4 is in the range of about 1 nm to about 200 nm. If the fourth thickness T4 is less than about 1 nm, charge leak may occur so that a high-speed operation of an electronic circuit becomes difficult. If the fourth thickness T4 is greater than about 200 nm, the heat dissipation efficiency of the electronic circuit may be difficult and a parasite capacitance may be increased so that a high-speed operation of an electronic device may become difficult.

No dielectric layer may be formed in the MEMS region R3. The MEMS region R3 is partially etched and, for example, an optical fiber may be disposed on the etched region. Additionally, the MEMS region R3 is a region where a MEMS structure (e.g., a cantilever structure) and an acceleration sensor may be formed through an etching process may be performed. Accordingly, a dielectric layer may not be formed in the MEMS region R3 for the etching process.

The optoelectronic integrated circuit substrate 100 may provide an optimal dielectric layer for the photonic device and the electronic device, and may not include a dielectric layer in the MEMS region R3, so that forming of a MEMS device becomes easier.

Although the second dielectric layer is formed in the electronic device region as shown in FIG. 1, example embodiments are not limited thereto. The second dielectric layer may not be formed in the electronic device region. The second dielectric layer may be formed in an ultra high-speed driving electronic device region of more than about 200 GHz, and may not be formed in a high-speed driving electronic device region having a frequency of less than about 40 GHz.

FIGS. 2A to 2D are views illustrating a method of fabricating an optoelectronic integrated circuit substrate 200 according to example embodiments.

Figure 2A:
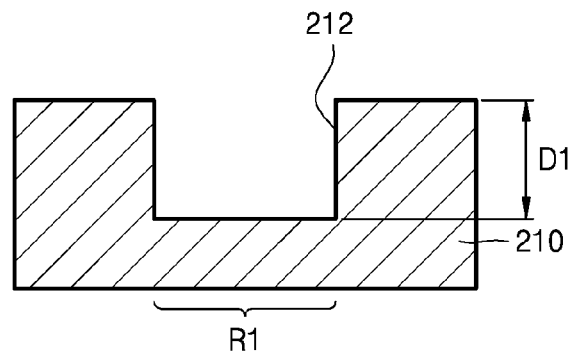
FIGS. 2A to 2D are views illustrating a method of fabricating an optoelectronic integrated circuit substrate according to example embodiments.

Referring to FIG. 2A, a wafer is prepared. The wafer includes a plurality of chip regions. In FIGS. 2A to 2D, a region corresponding to one chip region is illustrated, and hereinafter, the wafer is referred to as a first substrate 210.

The first substrate 210 may be formed of silicon, gallium arsenide, InP, or a conductive polymer. Hereinafter, it will be assumed that the first substrate 210 is a silicon substrate.

A photonic device region R1, where a photonic device is to be formed, is confined on the first substrate 210. The remaining region includes an electronic device region and a MEMS region where a MEMS structure is to be formed.

A trench 212 may be formed in the photonic device region R1 on the first substrate 210. The depth D1 of the trench 212 may be about 0.5 μm to about 3 μm. The trench 212 may be formed via a typical photolithography process well known in the semiconductor process.

Figure 2B:
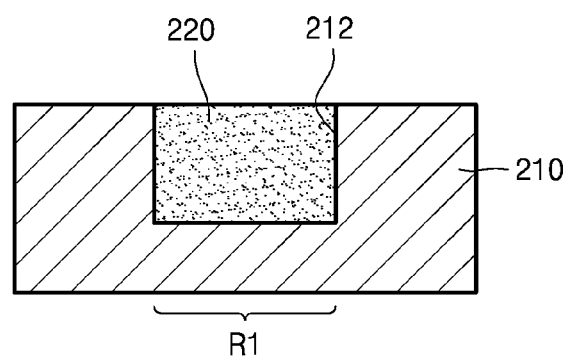

Referring to FIG. 2B, a dielectric 220 is coated on the first substrate 210 to fill the trench 212. The dielectric may be an oxide or a nitride, e.g., a silicon oxide or a silicon nitride.

The dielectric on an upper surface of the first substrate 210 is removed by performing a planarization process. As such, the trench 212 is filled with the dielectric 220. When the dielectric is air, a dielectric coating process and a planarization process may be omitted.

Figure 2C:
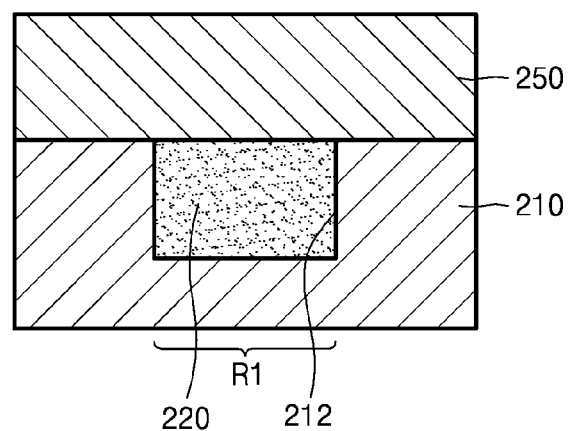

Referring to FIG. 2C, a second substrate 250 may be bonded on the first substrate 210. The second substrate 250 may be formed of the same material as the first substrate 210. The second substrate 250 may be bonded to cover the trench 212. The bonding may be a plasma bonding.

Figure 2D:
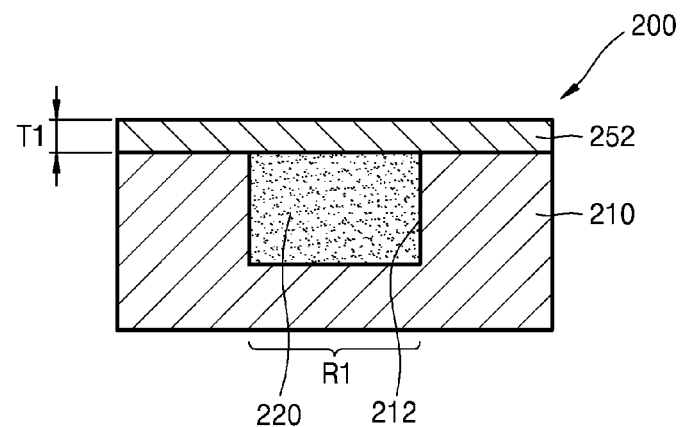

Referring to FIG. 2D, a third substrate 252 may be formed by thinning the second substrate 250. The third substrate 252 may have a thickness T1 of about 100 nm to about 500 nm. In this thinning process, after mechanical grinding or wet chemical etching is primarily performed, chemical mechanical polishing (CMP) may be performed.

Accordingly, the optoelectronic integrated circuit substrate 200 is completed. Then, a photonic device may be formed in the photonic device region R1 on the second substrate 252.

FIGS. 3A to 3F are views illustrating a method of fabricating an optoelectronic integrated circuit substrate 300 according to example embodiments.

Figure 3A:
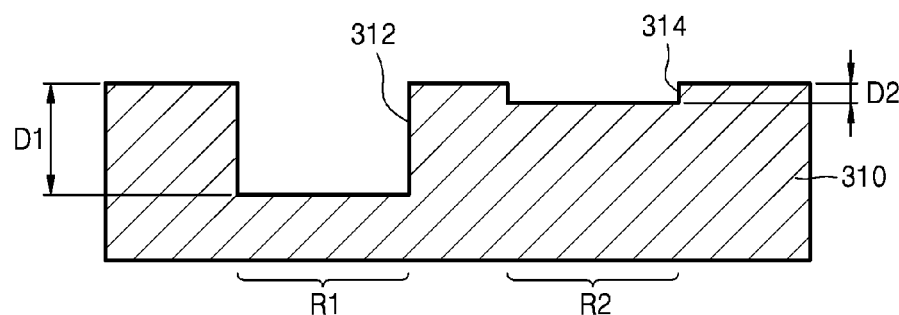
FIGS. 3A to 3F are views illustrating a method of fabricating an optoelectronic integrated circuit substrate according to example embodiments.

Referring to FIG. 3A, a wafer is prepared. The wafer includes a plurality of chip regions. In FIGS. 3A to 3F, a region corresponding to one chip region is illustrated, and hereinafter, the wafer is referred to as a first substrate 310.

The first substrate 310 may be formed of silicon, gallium arsenide, InP or a conductive polymer. Hereinafter, it will be assumed that the first substrate 310 is a silicon substrate.

A photonic device region R1, where a photonic device is to be formed, and an electronic device region R2, where an electronic device is to be formed, are confined on the first substrate 310. The remaining region includes a region where MEMS are to be formed or a region where another electronic device is to be formed.

A first trench 312 may be formed in the photonic device region R1 on the first substrate 310. The depth D1 of the first trench 312 may be about 0.5 μm to about 3 μm. The first trench 312 may be formed via a typical photolithography process that is well known in the semiconductor process.

A second trench 314 may be formed in the electronic device region R2 on the first substrate 310. The depth D2 of the second trench 314 may be about 1 nm to about 200 nm. The second trench 314 may be formed via a typical photolithography process that is well known in the semiconductor process.

Figure 3B:
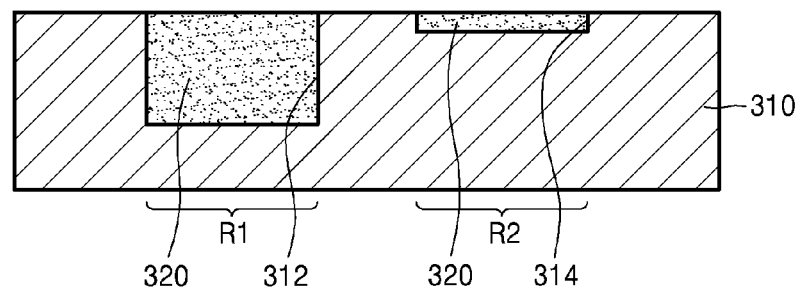

Referring to FIG. 3B, a dielectric 320 may be coated on the first substrate 310 to fill the first trench 312 and the second trench 314. The dielectric may be an oxide or a nitride, e.g., a silicon oxide or a silicon nitride.

The dielectric 320 on the first substrate 310 may be removed by performing a planarization process. The first trench 312 and the second trench 314 may be filled with the dielectric 320. When the dielectric is air, a dielectric coating process and a planarization process may be omitted.

Figure 3C:
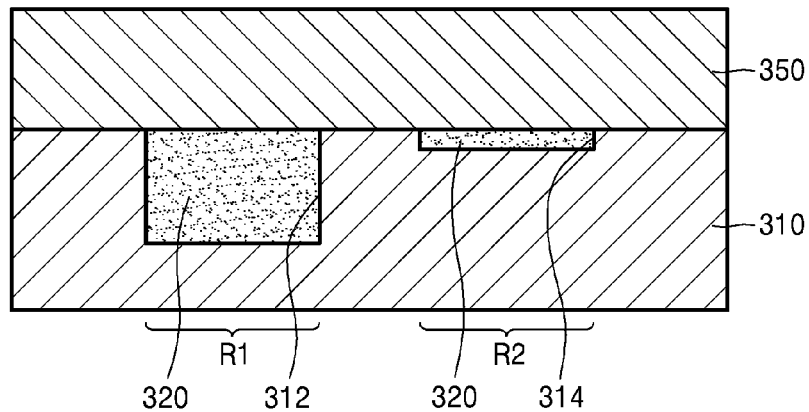

Referring to FIG. 3C, a second substrate 350 may be bonded on the first substrate 310. The second substrate 350 may be formed of the same material as the first substrate 310. The second substrate 350 may be bonded to cover the first trench 312 and the second trench 314. The bonding may be a plasma bonding.

Figure 3D:
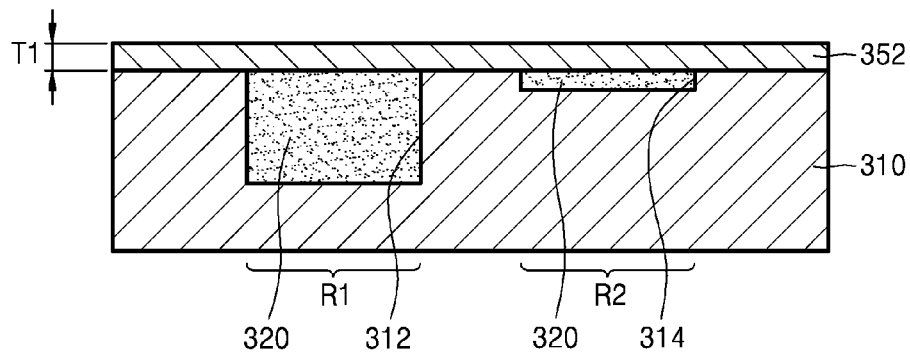

Referring to FIG. 3D, a third substrate 352 may be formed by thinning the second substrate 350. The third substrate 352 may have a thickness T1 of about 1 nm to about 100 nm. In this thinning process, after mechanical grinding or wet chemical etching is primarily performed, CMP may be performed. The thickness T1 of the third substrate 352 is suitable for electronic device characteristics.

Figure 3E:
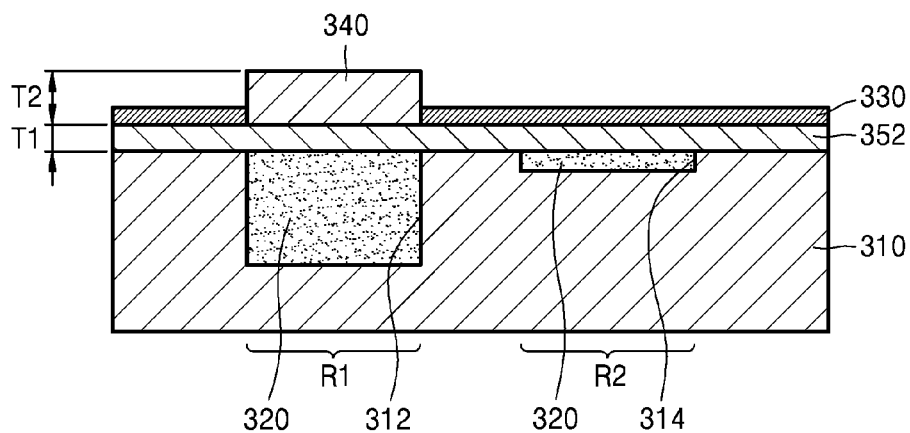

Referring to FIG. 3E, a mask 330 may be formed in a region except for the photonic device region R1. An epi layer 340 may be formed by epitaxially growing silicon on the exposed photonic device region R1. The sum of the thickness T2 of the epi layer 340 and the thickness T1 of the third substrate 352 ranges from about 100 nm to about 500 nm. If the second substrate 350 is formed of a material other than a semiconductor, a corresponding material may be coated on a region exposed through the mask 330.

Figure 3F:
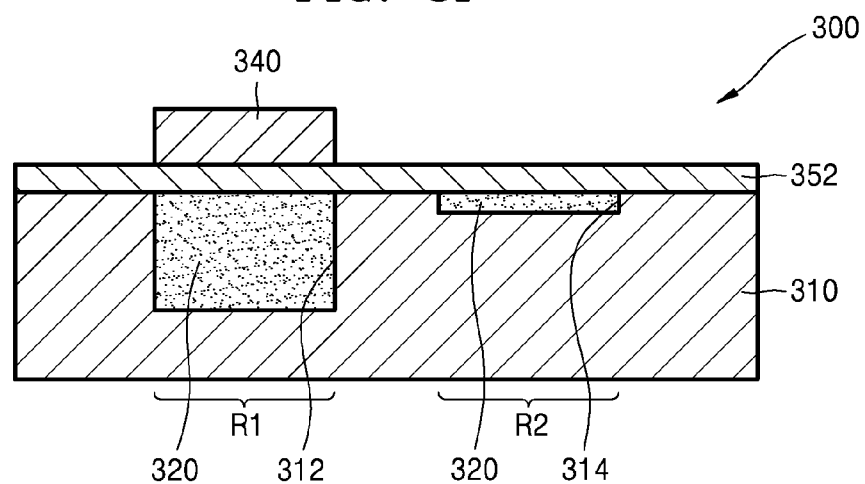

Referring to FIG. 3F, when the mask 330 is removed, the optoelectronic integrated circuit substrate 300 is completed. The thickness of the dielectric and the thickness of the second substrate may be suitable for the formation of a photonic device and an electronic device in the photonic device region R1 and the electronic device region R2, respectively.

Figure 4A:
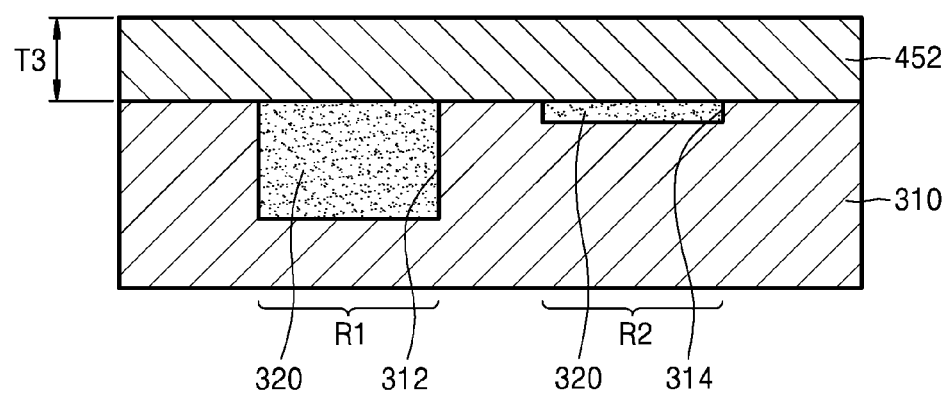
FIGS. 4A to 4C are views illustrating a method of fabricating an optoelectronic integrated circuit substrate according to example embodiments.
Figure 4B:
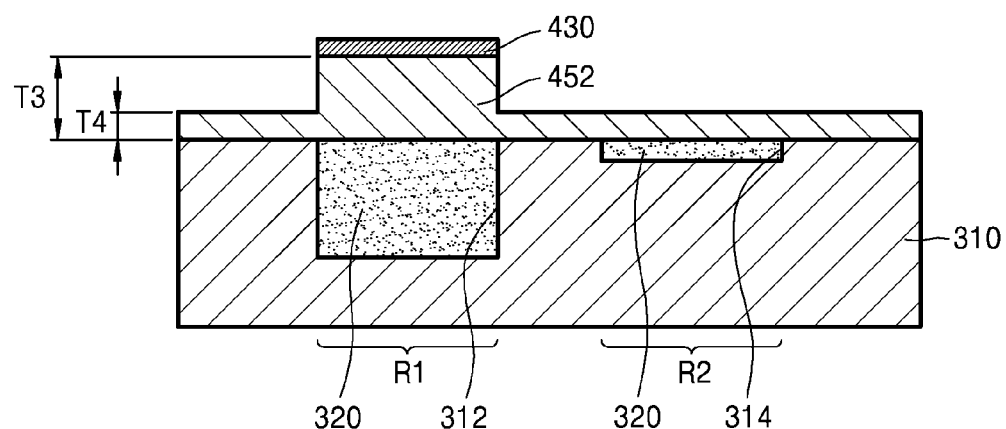
Figure 4C:
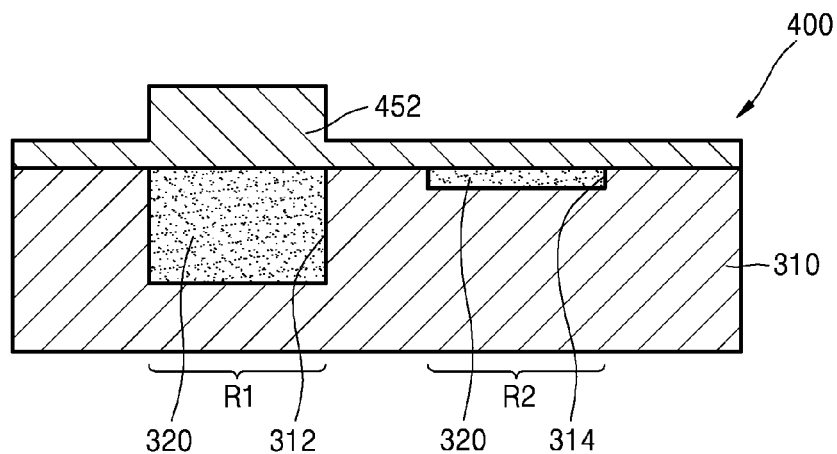

FIGS. 4A to 4C are views illustrating a method of fabricating an optoelectronic integrated circuit substrate 400 according to example embodiments. The processes of FIGS. 3A to 3C are identical to the process prior to the process of FIG. 4A, and description related to FIGS. 3A to 3C are used herein and detailed descriptions are omitted.

Referring to FIG. 4A, a third substrate 452 having a thickness T3 of about 100 nm to about 500 nm is formed by thinning the second substrate 350 in FIG. 3C. In this thinning process, after mechanical grinding or wet chemical etching is primarily performed, CMP may be performed. The thickness T3 of the third substrate 452 is suitable for photonic device characteristics.

Referring to FIG. 4B, a photoresist 430 may be formed on the third substrate 452 in the photonic device region R1. A portion of the third substrate 452 may be selectively etched to have a thickness T4 of about 1 nm to about 100 nm by selectively etching the third substrate 252 exposed to the photoresist 430.

Referring to FIG. 4C, when the photoresist 430 is removed, the optoelectronic integrated circuit substrate 400 is completed. The thickness of a dielectric and the thickness of a third substrate are suitable for the formation of a photonic device and an electronic device in the photonic device region R1 and the electronic device region R2, respectively.

Figure 5A:
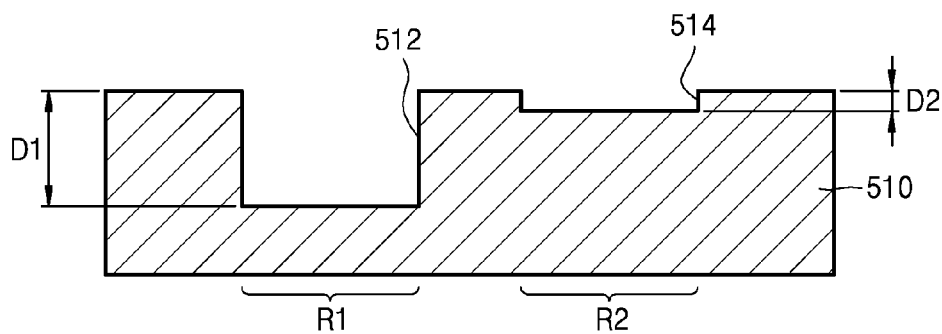
FIGS. 5A to 5F are views illustrating a method of fabricating an optoelectronic integrated circuit substrate according to example embodiments.

FIGS. 5A to 5F are views illustrating a method of fabricating an optoelectronic integrated circuit substrate 500 according to example embodiments. Referring to FIG. 5A, a wafer is prepared. The wafer includes a plurality of chip regions. In FIGS. 5A to 5F, a region corresponding to one chip region is illustrated, and hereinafter, the wafer is referred to as a first substrate 510.

The first substrate 510 may be formed of silicon, gallium arsenide, InP or a conductive polymer. Hereinafter, it will be assumed that the first substrate 510 is a silicon substrate.

A photonic device region R1, where a photonic device is to be formed, and an electronic device region R2, where an electronic device is to be formed, are confined on the first substrate 510. The remaining region includes a region where MEMS are to be formed or a region where another electronic device is to be formed.

A first trench 512 may be formed in the photonic device region R1 on the first substrate 510. The depth D1 of the first trench 512 may be about 0.6 µm to about 3.5 µm. The first trench 512 may be formed via a typical photolithography process well known in the art.

A second trench 514 may be formed in the electronic device region R2 on the first substrate 510. The depth D2 of the second trench 514 may be about 1 nm to about 200 nm. The second trench 514 may be formed via a typical photolithography process well known in the art.

Figure 5B:
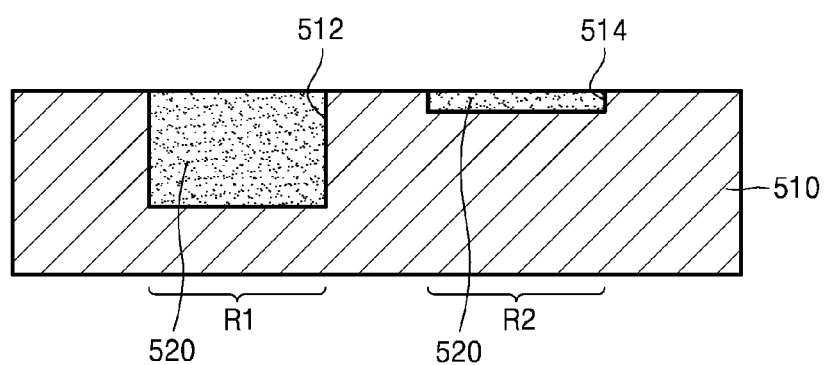

Referring to FIG. 5B, a dielectric 520 may be coated on the first substrate 510 to fill the first trench 512 and the second trench 514. The dielectric may be an oxide or a nitride, e.g., a silicon oxide or a silicon nitride.

The dielectric on the first substrate 510 may be removed by performing a planarization process. The first trench 512 and the second trench 514 may be filled with the dielectric 520. When the dielectric is air, a dielectric coating process and a planarization process may be omitted.

Figure 5C:
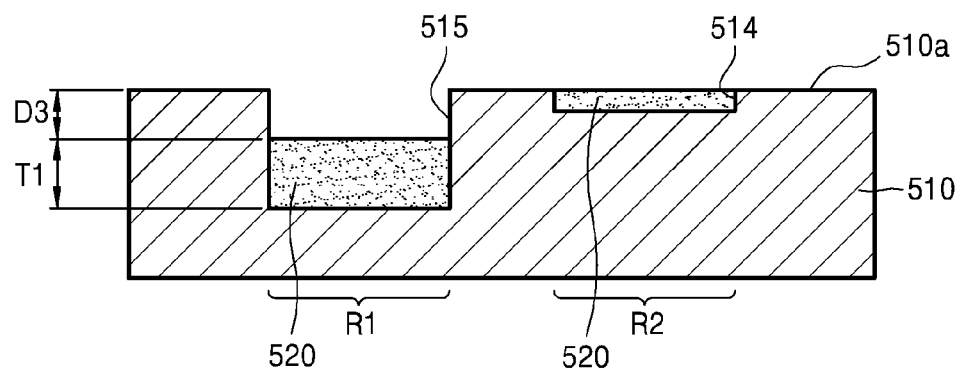

Referring to FIG. 5C, the dielectric 520 of the photonic device region R1 on a top surface 510a of the first substrate 510 may be selectively etched so that the dielectric 520 in the photonic device region R1 have the thickness T1 of about 0.5 µm to about 3 µm. In Accordingly, a concave part 515 may be formed in the first substrate 510, and the depth D3 of the concave part 515 ranges from about 100 nm to about 500 nm.

Figure 5D:
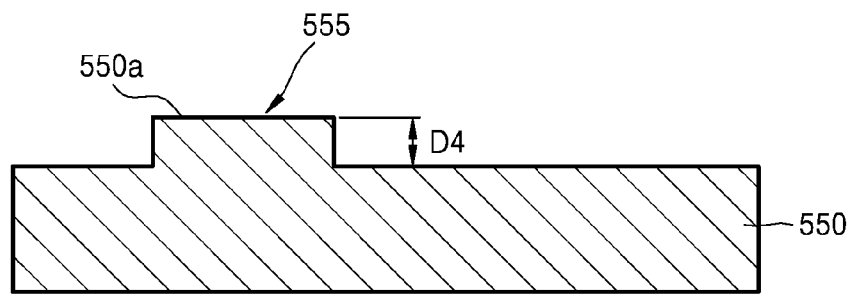

Referring to FIG. 5D, a second substrate 550 may be prepared. The second substrate 550 may be formed of the same material as the first substrate 510. A region except for a region corresponding to the photonic device region R1 of the first substrate may be etched to a depth D4 of about 100 nm to about 500 nm from one surface 550a of the second substrate 550. Accordingly, a convex part 555 may be formed on the second substrate 550. The depth D4 of the second substrate 550 may be identical to the depth D3 of the first substrate 510.

Figure 5E:
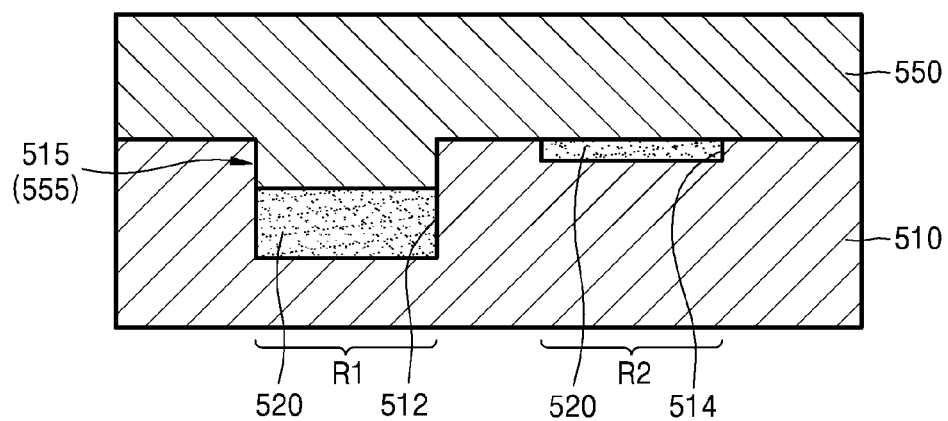

Referring to FIG. 5E, the first substrate 510 may be bonded to the second substrate 550 in order to allow the convex part 555 of the second substrate 550 to couple with the concave part 515 of the first substrate 510. The bonding allows the side having the convex part 555 of the second substrate to cover the first trench 512 and the second trench 514. The bonding may be a plasma bonding. Accordingly, a top surface of the resultant structure becomes relatively flat.

Figure 5F:
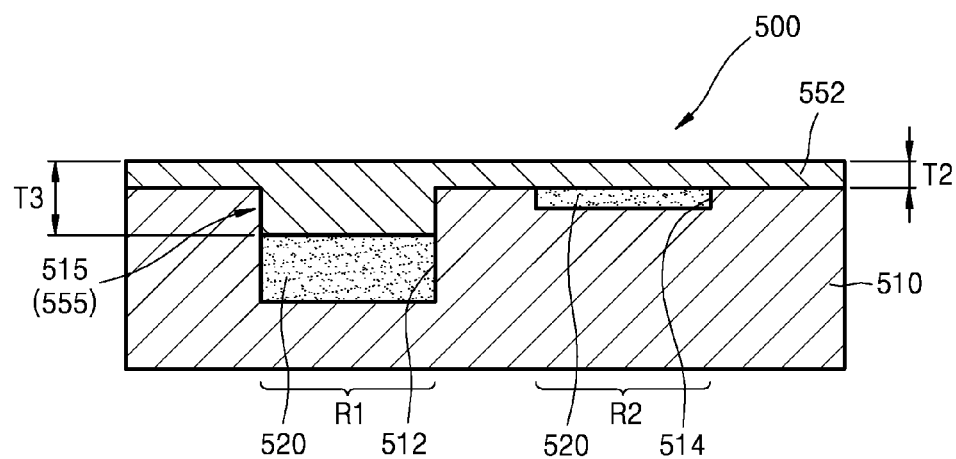

Referring to FIG. 5F, the third substrate 552 having a thickness T2 of about 1 nm to about 100 nm may be formed by thinning the substrate 550. A thickness T3 including the thickness of the convex part 555 may be about 100 nm to about 500 nm. In this thinning process, after mechanical grinding or wet chemical etching is primarily performed, CMP may be performed. As a result, the optoelectronic integrated circuit substrate 500 is completed. The thicknesses T2 and T3 of the second substrate 550 are suitable for electronic device and photonic device characteristics, respectively.

Figure 6:
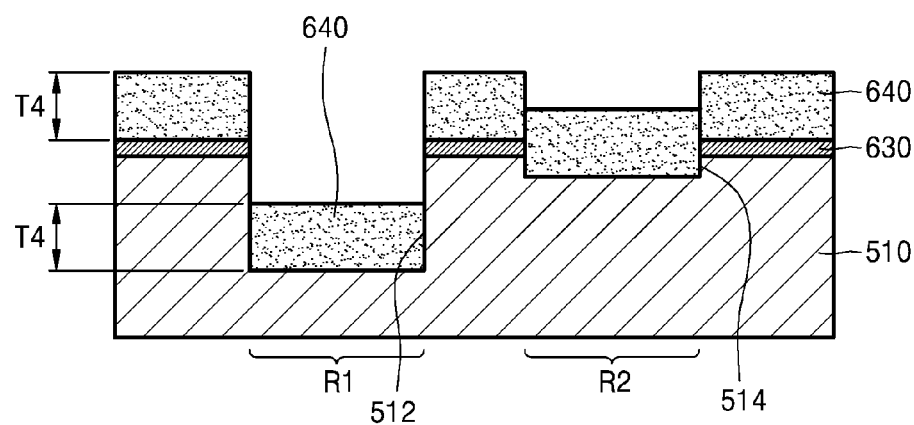
FIG. 6 is a view illustrating a method of fabricating an optoelectronic integrated circuit substrate according to example embodiments.

FIG. 6 is a view illustrating a method of fabricating an optoelectronic integrated circuit substrate according to example embodiments. This embodiment describes another method of fabricating the structure of FIG. 5C from the resultant structure of FIG. 5A.

Referring to FIG. 6, after a photoresist 630 is formed in a region except for the first trench 512 and the second trench 514 in the resultant structure of FIG. 5A, a dielectric 640 may be formed to have a fourth thickness T4 on the first substrate 510. The fourth thickness T4 is equal to the value obtained by subtracting the third depth D3 of FIG. 5C from the first depth D1 of FIG. 5A. The fourth thickness T4 may be in the range of about 0.5 μm to about 3 μm.

The photoresist 630 may be removed, and the dielectric 640 on the first substrate 510 may be removed by performing a planarization process. Then, the resultant structure of FIG. 5C is obtained. The following processes are substantially identical to those of FIGS. 5D to 5F, and thus, their detailed description will be omitted.

According to example embodiments, because the thickness and position of a dielectric layer are adjusted, and also, air, an oxide, or a nitride may be selectively used as the dielectric layer, a substrate providing optimal or improved regions for a photonic device and an electronic device, respectively, may be manufactured.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of fabricating an optoelectronic integrated circuit substrate, the method comprising:
    defining a photonic device region and an electronic device region on a first substrate;
    forming a first trench in the photonic device region and a second trench in the electronic device region, respectively, on a top surface of the first substrate, the first trench having a first depth and the second trench having a second depth smaller than the first depth;
    filling the first trench and the second trench with a dielectric, top surfaces of the dielectric in the first trench and the dielectric in the second trench having a same vertical position;
    bonding a second substrate on the top surface of the first substrate;
    thinning the second substrate to a first thickness; and
    forming regions of the second substrate corresponding to the photonic device region and the electronic device region to have a second thickness and a third thickness, respectively,
    wherein the second thickness is greater than the third thickness.

2. The method of claim 1, wherein the forming a first trench forms the first trench to a first depth in a range of about 0.5 μm to about 3 μm and the forming a second trench forms the second trench to a second depth in a range of about 1 nm to about 200 nm.

3. The method of claim 1, wherein the filling the first trench and the second trench fills the first trench and the second trench with the dielectric including at least one of air, an oxide, and a nitride.

4. The method of claim 1, wherein the forming regions of the second substrate corresponding to the photonic device region and the electronic device region to have a second thickness and a third thickness comprises:
    exposing the region of the second substrate corresponding to the photonic device region; and
    forming a layer having the same material as the second substrate to have the second thickness in the exposed region of the second substrate corresponding to the photonic device region, wherein the third thickness is equal to the first thickness.

5. The method of claim 4, wherein the forming regions of the second substrate corresponding to the photonic device region and the electronic device region to have a second thickness and a third thickness forms the region of the second substrate corresponding to the photonic device region to have the second thickness in a range of about 100 nm to about 500 nm and forms the region of the second substrate corresponding to the electronic device region to have the third thickness in a range of about 1 nm to about 100 nm.

6. The method of claim 1, wherein forming regions of the second substrate corresponding to the photonic device region and the electronic device region to have a second thickness and a third thickness comprises:
    exposing the region of the second substrate corresponding to the electronic device region; and
    selectively etching the exposed region of the second substrate corresponding to the electronic device region to have a thickness equal to the third thickness, wherein the second thickness is equal to the first thickness.

7. The method of claim 6, wherein the forming regions of the second substrate corresponding to the photonic device region and the electronic device region to have a second thickness and a third thickness forms the region of the second substrate corresponding to the photonic device region to have the second thickness in a range of about 100 nm to about 500 nm and forms the region of the second substrate corresponding to the electronic device region to have the third thickness is in a range of about 1 nm to about 100 nm.

8. The method of claim 1, further comprising:
    defining a micro-electromechanical systems (MEMS) region on a first substrate, the MEMS region having a MEMS structure formed thereon,
    wherein a dielectric is not formed in the MEMS region.

9. A method of fabricating an optoelectronic integrated circuit substrate, the method comprising:
    defining a photonic device region and an electronic device region on a first substrate;
    forming a first trench in the photonic device region and a second trench in the electronic device region, respectively, on a top surface of the first substrate, the first trench and the second trench having a first depth and a second depth, respectively;
    filling the first trench and the second trench with a dielectric;
    forming a concave part by selectively etching the dielectric of the photonic device region to a first thickness from the top surface of the first substrate;
    forming a convex part by etching a region of a second substrate different from a region corresponding to the photonic device region to the first thickness;
    coupling the convex part with the concave part by bonding the second substrate on the top surface of the first substrate; and
    thinning the second substrate to have a second thickness on a top surface of the dielectric in the photonic device region and a third thickness on a top surface of the dielectric in the electronic device region.

10. The method of claim 9, wherein the forming a first trench forms the first trench to a first depth in a range of about 0.5 μm to about 3 μm and the forming a second trench forms the second trench to a second depth in a range of about 1 nm to about 200 nm.

11. The method of claim 9, wherein the filling the first trench and the second trench fills the first trench and the second trench with the dielectric including at least one of air, an oxide, and a nitride.

12. The method of claim 9, wherein the forming a concave part by selectively etching the dielectric of the photonic device region to a first thickness includes selectively etching the dielectric of the photonic device region to the first thickness in a range of about 100 nm to about 500 nm.

13. The method of claim 9, wherein the thinning the second substrate to have a second thickness on a top surface of the dielectric in the photonic device region and a third thickness on a top surface of the dielectric in the electronic device region includes thinning the second substrate to have the second thickness in a range of about 100 nm to about 500 nm and thinning the second substrate to have the third thickness in a range of about 1 nm to about 100 nm.

14. The method of claim 9, wherein the filling the first trench and the second trench with a dielectric comprises:
    filling each of the first trench and the second trench with the dielectric having a fourth thickness; and
    removing the dielectric in the second trench on the top surface of the first substrate,
    wherein the fourth thickness is less than the first depth by the first thickness.

15. The method of claim 14, wherein the filling each of the first trench and the second trench with the dielectric having a fourth thickness fills each of the first trench and the second trench with the dielectric having the fourth thickness in a range of about 0.5 μm to about 3 μm.

* * * * *